US012760405B2

(12) United States Patent
Matsunaka et al.

(10) Patent No.: US 12,760,405 B2
(45) Date of Patent: Oct. 13, 2026

(54) FILM FORMATION APPARATUS AND FILM FORMATION METHOD

(71) Applicant: SHIBAURA MECHATRONICS CORPORATION, Yokohama (JP)

(72) Inventors: Shigeki Matsunaka, Yokohama (JP); Atsushi Fujita, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 490 days.

(21) Appl. No.: 18/029,054

(22) PCT Filed: Sep. 15, 2021

(86) PCT No.: PCT/JP2021/033945
§ 371 (c)(1),
(2) Date: Mar. 28, 2023

(87) PCT Pub. No.: WO2022/070922
PCT Pub. Date: Apr. 7, 2022

(65) Prior Publication Data

US 2023/0366077 A1 Nov. 16, 2023

(30) Foreign Application Priority Data

Sep. 29, 2020 (JP) ................................ 2020-163504
Sep. 10, 2021 (JP) ................................ 2021-147866

(51) Int. Cl.
*H10P 14/22* (2026.01)
*C23C 14/06* (2006.01)
(Continued)

(52) U.S. Cl.
CPC ...... *C23C 14/0617* (2013.01); *C23C 14/3485* (2013.01); *C23C 14/48* (2013.01);
(Continued)

(58) Field of Classification Search
CPC . C23C 14/0617; C23C 14/3485; C23C 14/48; C23C 14/34; C23C 14/505;
(Continued)

(56) References Cited

U.S. PATENT DOCUMENTS

2002/0023831 A1* 2/2002 Iwase ...................... C23C 14/35 204/192.12
2009/0114942 A1* 5/2009 Yokoyama ....... H10H 20/01335 438/46
(Continued)

FOREIGN PATENT DOCUMENTS

CN 109830429 A 5/2019
JP 2009124100 A 6/2009
(Continued)

*Primary Examiner* — Marlon T Fletcher
*Assistant Examiner* — Da Wei Lee
(74) *Attorney, Agent, or Firm* — Nath, Goldberg & Meyer; Jerald L. Meyer

(57) ABSTRACT

According to an embodiment, a film formation apparatus and a film formation method that can form GaN film with high productivity are provided. The film formation apparatus includes: the chamber which an interior thereof can be made vacuum; the rotary table provided inside the chamber, holding a workpiece, and circulating and transporting the workpiece in a circular trajectory, a GaN film formation processing unit including a target formed of film formation material containing GaN and a plasma generator which turns sputtering gas introduced between the target and the rotary table into plasma, the GaN film formation processing unit depositing by sputtering particles of the film formation material containing GaN on the workpiece circulated and transported by the rotary table; and a nitriding processing unit nitriding particles of the film formation material deposited on the workpiece circulated and transported by the rotary table in the GaN film formation processing unit.

11 Claims, 6 Drawing Sheets

(51) Int. Cl.
*C23C 14/34* (2006.01)
*C23C 14/48* (2006.01)
*H01J 37/34* (2006.01)
*H10P 14/20* (2026.01)

(52) U.S. Cl.
CPC .......... *H01J 37/3467* (2013.01); *H10P 14/22* (2026.01); *H10P 14/3416* (2026.01)

(58) Field of Classification Search
CPC ... C23C 14/586; C23C 14/0641; C23C 14/32; C23C 14/3464; C23C 14/541; C23C 14/568; H01J 37/3467; H01L 21/0254; H01L 21/02631; H10P 14/22; H10P 14/3416; H10P 14/6329
See application file for complete search history.

(56) References Cited

U.S. PATENT DOCUMENTS

2018/0286644 A1* 10/2018 Kawamata ........... H01J 37/3411
2021/0254212 A1* 8/2021 Tanabe .................. C23C 14/541

FOREIGN PATENT DOCUMENTS

JP 2012222004 A 11/2012
JP 2013125851 A * 6/2013
JP 2013145860 A 7/2013
JP 2015-103652 A 6/2015
WO 2016009577 A1 1/2016

* cited by examiner

FILM FORMATION APPARATUS AND FILM FORMATION METHOD

This is a National Phase Application filed under 35 U.S.C. 371 as a national stage of PCT/JP2021/033945, filed Sep. 15, 2021, and application claiming the benefit of Japanese Application No. 2020-163504, filed Sep. 29, 2020 and Japanese Application No. 2021-147866, filed Sep. 10, 2021, the content of each of which is hereby incorporated by reference in its entirety.

FIELD OF INVENTION

The present disclosure relates to a film formation apparatus and a film formation method.

BACKGROUND

GaN (Gallium Nitride) is getting attention as next-generation device material. For example, devices using GaN include light emitting devices, power devices, and high-frequency communication devices. Such GaN devices are fabricated by forming GaN film on silicon (Si) wafers, silicon carbide (SiC) wafers, sapphire substrates, and glass substrates. Conventionally, the GaN film has been formed by MO-CVD (Metal Organic Chemical Vapor Deposition) method. The MO-CVD method is a film formation method, in which material gas containing organic metal is transported onto a heated substrate by carrier gas and the material is decomposed and chemically reacted using chemical vapor deposition to form film.

PRIOR ART DOCUMENT

Patent Document

Patent Document 1: JP 2015-103652 A

SUMMARY OF INVENTION

Problems to be Solved by Invention

However, the formation of the GaN film by the MO-CVD method had a problem in productivity for following reasons. Firstly, gallium (Ga) is liquid under normal temperature and normal pressure, and large amount of NH3 gas used in the process is required to suppress evaporation of Ga and to react Ga with nitrogen (N). This results insufficient usage of the material. Furthermore, since it is difficult to handle the material gas and it is difficult to keep the condition of the device stable, yield is low. Since the MO-CVD method requires high temperature processing at a level of 1000° C. to completely decomposes NH3 gas, high-power heating apparatus is required, which is costly. In addition, since hydrogen (H) contained in the processing gas is captured in the formed GaN film at the time of processing, extra dehydrogenation process is required.

The present disclosure is proposed to address the above-described problem, and the objective is to provide a film formation apparatus and a film formation method that can form GaN film with high productivity.

Means to Solve the Problem

To achieve the above objective, a film formation apparatus of the present embodiment includes: a chamber which an interior thereof can be made vacuum; a rotary table provided inside the chamber, holding a workpiece, and circulating and transporting the workpiece in a circular trajectory, a GaN film formation processing unit including a target formed of film formation material containing GaN and a plasma generator which turns sputtering gas introduced between the target and the rotary table into plasma, the GaN film formation processing unit depositing by sputtering particles of the film formation material containing GaN on the workpiece circulated and transported by the rotary table; and a nitriding processing unit nitriding particles of the film formation material deposited on the workpiece circulated and transported by the rotary table in the GaN film formation processing unit.

A film formation method of the present embodiment circulating and transporting a workpiece by a rotary table in a circular trajectory and forming film on the workpiece in a chamber which an interior thereof can be made vacuum, the method comprising: GaN film formation processing of depositing by sputtering particles of the film formation material containing GaN on the workpiece circulated and transported by the rotary table in a GaN film formation processing unit including a target formed of the film formation material containing GaN and a plasma generator making sputtering gas introduced between the target and the rotary table into plasma; and the nitriding processing of nitriding the particles of the film formation material deposited on the workpiece circulated and transported by the rotary table in the GaN film formation processing unit.

Effect of Invention

According to the present disclosure, a film formation apparatus and a film formation method that can form GaN film with high productivity can be provided.

EMBODIMENTS

Embodiments of the film formation apparatus are described in detail with the reference to the figures.

SUMMARY

Figure 1:
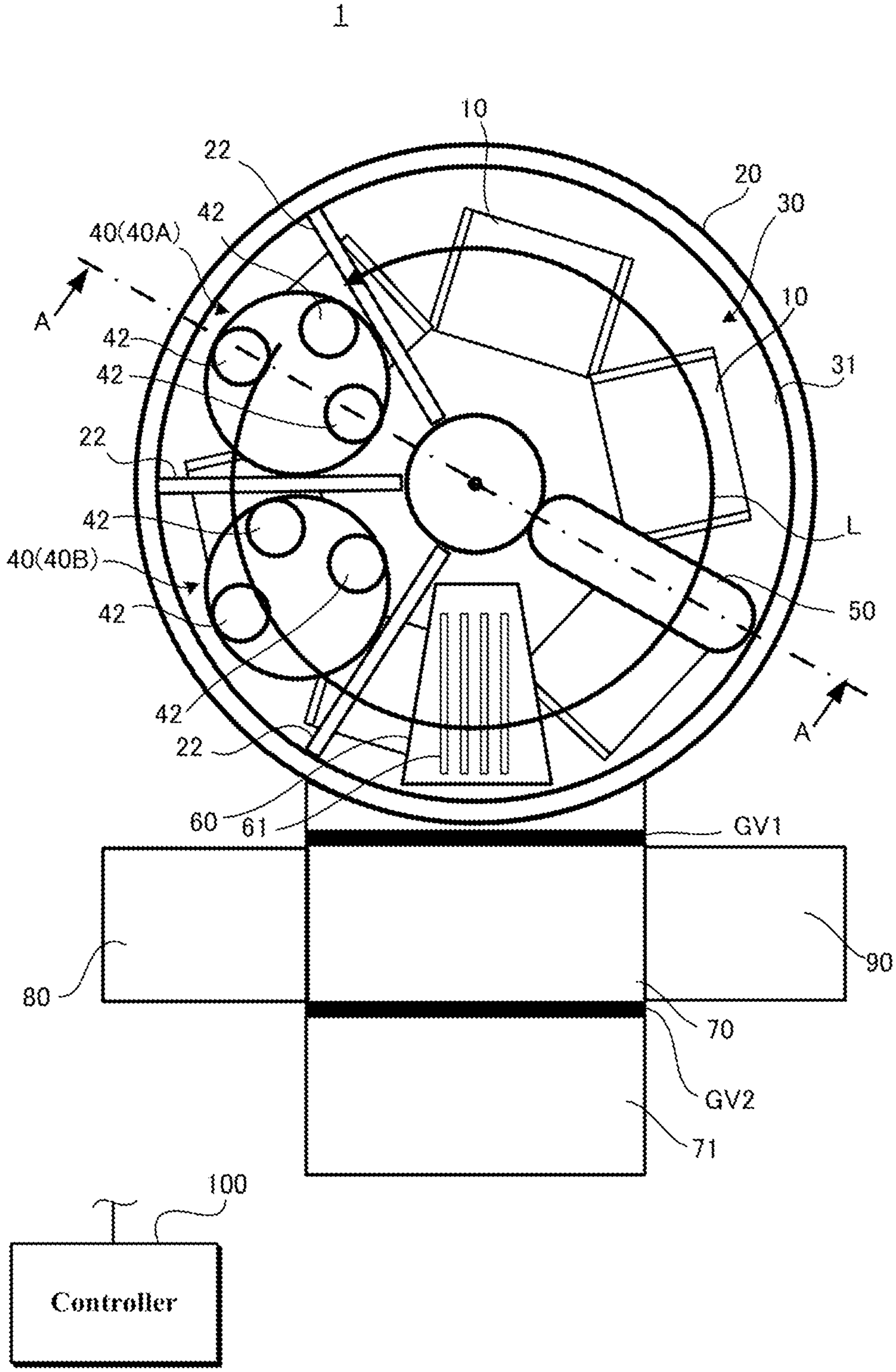
FIG. 1 is a transparent plan view schematically illustrating the configuration of the film formation apparatus according to the embodiment.

A film formation apparatus 1 shown in FIG. 1 is an apparatus for forming GaN (Gallium Nitride) film or AlN (Aluminum Nitride) on a workpiece 10 that is a film formation target by sputtering. For example, the workpiece is silicon (Si) wafers, silicon carbide (SiC) wafers, sapphire substrates, and glass substrates.

The film formation apparatus 1 includes a chamber 20, a transporting unit 30, a film formation processing unit 40, a nitriding processing unit 50, a heating unit 60, a transfer chamber 70, a pre-heating chamber 80, a cooling chamber 90, and a controller 100. The chamber 20 is a container which can make an interior thereof vacuum. The chamber 20 is cylindrical, and the interior thereof is divided into a plurality of sections. The film formation processing unit 40 is arranged in two fan-shaped sections divided by a divider 22. The nitriding processing unit 50 and a heating unit 60 is arranged in sections other than the sections in which the film formation processing unit 40 is arranged.

As the film formation processing unit 40, a GaN film formation processing unit 40A to form GaN film using material containing GaN as a target 42 is arranged in one section, and a Al film formation processing unit 40B to form Al film using material containing GaN as a target 42 is arranged in the other section. The workpiece 10 goes around inside the chamber 20 along the circumferential direction multiple times, so that the workpiece 10 alternately passes through the GaN film formation processing unit 40A and the nitriding processing unit 50, and the formation of GaN film on the workpiece 10 and the nitriding of Ga are alternately repeated to grow the GaN film with desirable thickness.

Furthermore, the workpiece 10 goes around inside the chamber 20 along the circumferential direction multiple times, so that the workpiece 10 alternately passes through the Al film formation processing unit 40B and the nitriding processing unit 50, and the formation of AlN film on the workpiece 10 and the nitriding of Al are alternately repeated to grow the AlN film with desirable thickness. Thus, the formation of GaN film and AlN film is repeated, and the GaN film and AlN film is alternately formed.

The nitriding processing unit 50 is further provided while using the material containing GaN as the target 42 for the following reason. That is, since the melting point of Ga is low and Ga is in liquid state under normal temperature and normal pressure, Ga must contain nitrogen (N) to be the solid target 42. Accordingly, it is considered to simply increase the nitrogen content of the target 42 and form the film only by the sputtering of the target 42.

Here, DC discharge sputtering is preferred than RF discharge sputtering to improve the film formation rate. However, when a large amount of nitrogen is contained in the target 42, a surface thereof becomes insulated. DC discharge may not be produced in the target 42 with the insulated surface.

That is, there is a limit for the nitrogen content in the GaN target 42, making the nitriding of Ga in the target 42 insufficient. That is, Ga atoms which do not bond with N (nitrogen) atoms are contained in the target 42 containing GaN.

Furthermore, when nitrogen gas is added to sputtering gas introduced into the film formation processing unit 40 for sputtering, the surface of the target 42 is nitrided and insulated. Therefore, nitrogen gas cannot be added to the sputtering gas in the GaN film formation processing unit 40A to supplement lacking nitrogen. In contrast, if the nitrogen content in the formed GaN film is low and there is nitrogen defect, the crystallinity and flatness of the film become worse. Therefore, to supplement the lack of nitrogen, the nitriding is further performed on the GaN film formed in the nitriding processing unit 50 after the film formation in the GaN film formation processing unit 40A.

[Chamber]

Figure 2:
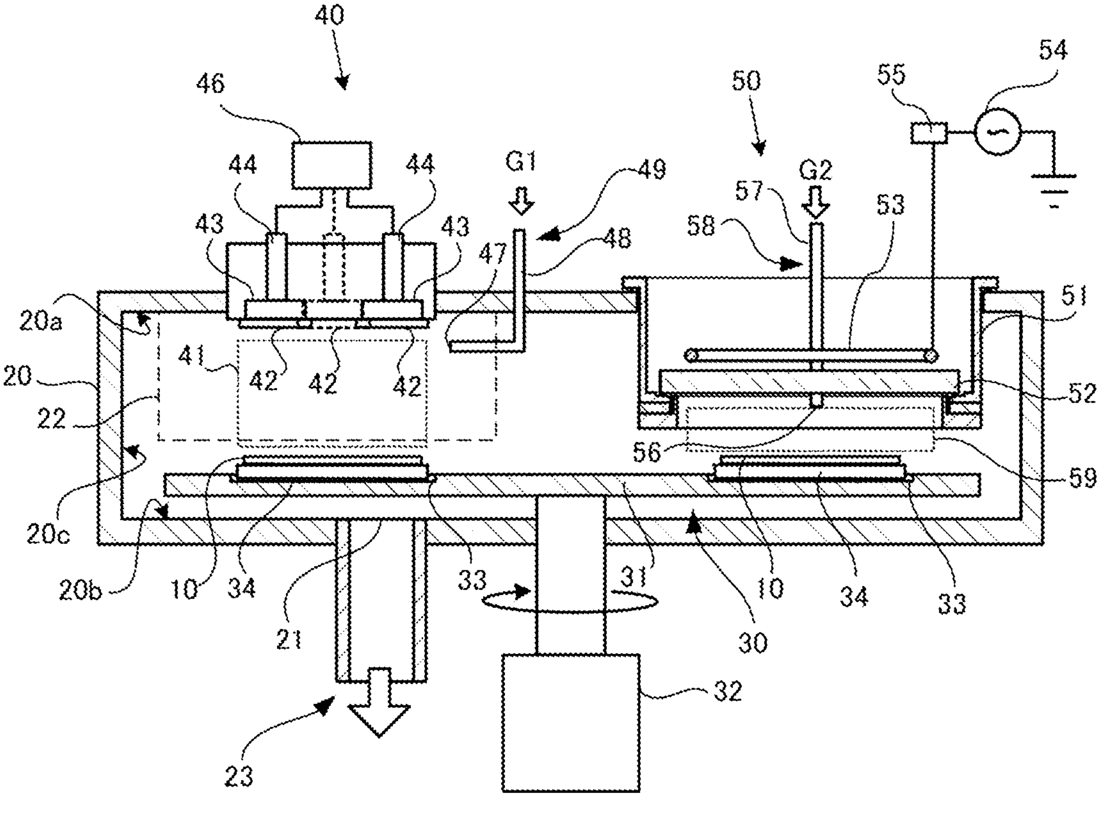
FIG. 2 is an A-A cross sectional diagram of FIG. 1 and is a detailed view of an inner structure of the film formation apparatus according to the embodiment in FIG. 1 viewed from the side.

As illustrated in FIG. 2, the chamber 20 is formed by a disk ceiling 20*a*, a disk inner bottom 20*b*, and a cylindrical inner surface 20*c*. The divider 22 is a square wall plate arranged radially from a center of the cylinder, and extends from the ceiling 20*a* toward the inner bottom 20*b* but does not reach the inner bottom 20*b*. That is, a cylindrical space is ensured at the inner-bottom-20*b* side.

A rotary table 31 to transport the workpiece 10 is arranged in this cylindrical space. A lower end of the divider 22 faces a surface of the rotary table 31 with a gap for the workpiece 10 placed on the rotary table 31 to pass through. A processing space 41 for processing the workpiece 10 by the film formation processing unit 40 is divided by the divider 22. Furthermore, a processing space 59 is divided by a cylinder 51 of the nitriding processing unit 50 described later. That is, the film formation processing unit 40 and the nitriding processing unit 50 each have the processing space 41 and 59 that are smaller than the chamber 20 and are apart from each other. The divider 22 can prevent sputtering gas G1 of the film formation processing unit 40 from diffusing in the chamber 20. The cylinder 51 of the nitriding processing unit 50 can prevent processing gas G2 from diffusing in the chamber 20.

Furthermore, as described later, although plasma is generated in the processing spaces 41 and 59 in the film formation processing unit 40 and the nitriding processing unit 50, since only the pressure in the processing spaces 41 and 59 that are divided and smaller than the chamber 20 needs to be adjusted, pressure adjustment can be easily performed, and plasma discharge can be stabilized. Therefore, there should be at least two dividers 22 sandwiching the film formation processing unit 40 in plan view if aforementioned effect is achieved.

Note that an exhaustion port 21 is provided in the chamber 20. An exhaustion unit 23 is connected to the exhaustion port 21. The exhaustion unit 23 has piping and unillustrated pumps and valves, and others. The chamber 20 can be depressurized and made vacuum by exhaustion using the exhaustion unit 23 via the exhaustion port 21. In order to suppress oxygen concentration low, the exhaustion unit 23 exhausts the chamber 23 until degree of vacuum becomes, for example, $10^{-4}$ Pa.

[Transporting Unit]

The transporting unit 30 includes the rotary table 31, a motor 32, and a holder 33, and circulates and transports the workpiece 10 along a transporting path L that has a circular trajectory. The rotary table 31 has a disk-shape and expands to a size that does not contact with an inner surface 20*c*. The motor 32 continuously rotates the rotary table 31 around the circular center as the rotation axis at predetermined rotation speed. For example, the rotary table 31 rotates at speed of 1 to 150 rpm.

The holder 33 is grooves, holes, protrusions, fits, or holders, and the like arranged on an upper surface of the rotary table 31 at circumferentially equal intervals, and holds a tray 34, on which the workpiece 10 is placed, by mechanical chucks or adhesive chucks. For example, the workpiece W is arranged in matrix alignment on the tray 34, and six holders 33 are arranged on the rotary table 31 at 60 degrees interval. That is, the film formation apparatus 1 can form film on a plurality of the workpieces 10 held on a plurality of holders at once, resulting in high productivity. Note that the tray 34 may be omitted and the workpiece 10 may be directly placed on the upper surface of the rotary table 31.

[Film Formation Processing Unit]

The film formation processing unit 40 generates plasma and exposes the target 42 formed of film formation material to the plasma. By this, ions contained in the plasma bombards the target 42 and deposits particles (hereinafter, referred to as a sputtering particle) beaten out from the film formation material into the workpiece 10 to form the film. As illustrated in FIG. 2, the film formation processing unit 40 includes the target 42, a sputtering source formed by a backing plate 43 and an electrode 44, and a plasma generator formed by a power supply 46 and a sputtering gas introducer 49.

The target 42 is a tabular component formed of the film formation material that will be the film deposited on the workpiece 10. The film formation material forming the target 42 in the GaN film formation processing unit 40A in the present embodiment is material containing Ga and GaN, and the target 42 is a source for the sputtering particles containing Ga atoms to be deposited on the workpiece 10. As described above, since the nitrogen content is limited, the target 42 contains GaN and deficient GaN that lacks nitrogen, that is, Ga atom that lacks bonding with nitrogen (N).

Furthermore, the film formation material forming the target 42 in the Al film formation processing unit 40B is material containing Al, and the target 42 is a source for the sputtering particles containing Al atoms to be deposited on the workpiece 10. Note that the target 42 for sputtering may contain atoms other than Ga, Al, and nitrogen (N) if it can supply sputtering particles containing Ga atoms and sputtering particles containing Al atoms.

The target 42 is provided distantly from the transporting path L of the workpiece 10 placed on the rotary table 31. The target 42 is held on the ceiling 20*a* of the chamber 20 to face the workpiece 10 placed on the rotary table 31. For example, three targets 42 are installed. Three targets 42 are provided in at positions that are apexes of a triangle in a plan view.

The backing plate 43 is a supporting component to hold the target 42. The backing plates 43 hold the targets 42 respectively. The electrode 44 is a conductive component for separately applying electric power to each target 42 from outside the chamber 24 and is electrically connected to the target 42. The electrical power applied to each target 42 may be separately modified. If necessary, magnets, cooling mechanism, and the like may be provided to the sputtering source as appropriate.

The power supply 46 is, for example, DC power supply that applies high voltage and is electrically connected to the electrode 44. The power supply 46 applies electric power to the target 42 via the electrode 44. Note that the rotary table 31 is at the same potential as the grounded chamber 20, and the potential difference is produced by applying high voltage to the target-42 side.

As illustrated in FIG. 2, the sputtering gas introducer 49 introduces sputtering gas G1 into the chamber 20. The sputtering gas introducer 49 includes an unillustrated source for the sputtering gas G1 such as a cylinder, piping 48, and a gas inlet 47. The piping 48 is connected to the source for the sputtering gas G1, air-tightly penetrates the chamber 20, and extends into an interior of the chamber 20, and an end thereof opens as the gas inlet 47. The sputtering gas introducer 49 of the present embodiment introduces the sputtering gas G1 into the processing space 41 so that pressure in the processing space 41 becomes 0.1 Pa to 0.3 Pa.

The gas inlet 47 opens between the rotary table 31 and the target 42 and introduces the sputtering gas G1 for film formation into the processing space 41 formed between the rotary table 31 and the target 42. Noble gas is employed for the sputtering gas G1, and argon gas and the like is suitable. The sputtering gas G1 is gas not containing nitrogen (N) and may be single gas of Argon (Ar).

In the film formation processing unit 40, when the sputtering gas G1 is introduced from the sputtering gas introducer 49 and high voltage is applied to the target 42 by the power supply 46 via the electrode 44, the sputtering gas G1 introduced in the processing space 41 formed between the rotary table 31 and the target 42 becomes plasma, and active species such as ions is produced. The ions in the plasma bombards the target 42 and beat out sputtering particles. In the GaN film formation processing unit 40A, the ions bombard the target 42 formed of material containing Ga and GaN and beats out the sputtering particles containing Ga atoms. In the Al film formation processing unit 40B, the ions bombard the target 42 formed of material containing Al and beats out the sputtering particles containing Al atoms.

Furthermore, the workpiece 10 circulated and transported by the rotary table 31 passes through the processing space 41. The beaten out sputtering particles are deposited on the workpiece 10 when the workpiece 10 passes through the processing space 41, and film containing Ga or film containing Al is formed on the workpiece 10. The workpiece 10 is circulated and transported by the rotary table 31 and repeatedly passes through the processing space 41, to perform the film formation process. Note that the GaN film containing Ga and the AlN film containing Al are not formed simultaneously, and either of the film is formed after other of the film is formed.

[Nitriding Processing Unit]

The nitriding processing unit 50 generates inductively coupled plasma inside the processing space 59 into which the processing gas G2 containing nitrogen gas was introduced. That is, the nitriding processing unit 50 produces plasma nitrogen gas to generate chemical species. Nitrogen atoms contained in the generated chemical species bombards the film containing Ga atoms and the film containing Al atoms formed on the workpiece 10 by the film formation processing unit 40 and bonds with Ga atoms lacking bonding with nitrogen in the film containing Ga atoms and Al atoms in the film containing Al atoms. As a result, GaN film and AlN film without nitrogen deficiency can be obtained.

As illustrated in FIG. 2, the nitriding processing unit 50 includes a cylinder body 51, a window 52, an antenna 53, a RF power supply 54, a matching box 55, and a plasma generator formed by a processing gas introducer 58.

The cylinder body 51 is a component that covers the surrounding of the processing space 59. As illustrated in FIGS. 1 and 2, the cylinder body 51 is a cylinder with rectangular horizontal cross-section and rounded corners, and has an opening. The cylinder body 51 is fit in the ceiling 20*a* of the chamber 20 so that the opening thereof faces the rotary-table-31 side with distance, and protrudes into the interior space of the chamber 20. The cylinder body 51 is formed of material as same as the rotary table 31.

The window 52 is a flat plate of dielectric material such as quartz with a shape that is substantially the same as the horizontal cross-section of the cylinder body 51. The window 52 is provided to block the opening of the cylinder body 51 and divides the processing space 59 in the chamber 20 into which the processing gas G2 containing nitrogen gas is introduced and the interior of the cylinder body 51. The window 52 needs to suppress the oxidation caused by oxygen flowing into the processing space 59. For example, the required oxygen concentration is very low as $10^{19}$ (atom/$cm^3$) or less. To cope with this, a surface of the window 52 is coated with protective coating. For example, by coating the surface of the window 52 by Y2O3 (yttrium oxide), oxygen released from the surface of the window 52 is suppressed while suppressing wear of the window 52 due to plasma, enabling to keep the oxygen concentration low.

The processing space 59 is formed between the rotary table 31 and the interior of the cylinder body 51 in the nitriding processing unit 50. Furthermore, the workpiece 10 circulated and transported by the rotary table 31 repeatedly passes through the processing space 59 to perform the nitriding process. Note that the window 52 may be dielectric such as alumina or semiconductors such as silicon.

The antenna 53 is a conductor wound in a coil-shape, is arranged in the interior space of the cylinder body which is separated from the processing space 59 in the chamber 20 by the window 52, and generates electric field when AC current is applied. To efficiently introduce the electric field generated from the antenna 53 to the processing space 59 via the window 52, it is desirable to arrange the antenna 53 near the window 52. The RF power supply 54 to apply high-frequency voltage is connected to the antenna 53. The matching box 55 that is a matching circuit is connected in series to the output side of the RF power supply 54. The matching box 55 stabilizes plasma discharge by matching impedance at the input side and the output side.

As illustrated in FIG. 2, the processing gas introducer 58 introduces the processing gas G2 into the processing space 59. The processing gas introducer 58 includes an unillustrated source for the processing gas G2 such as a cylinder, piping 57, and a gas inlet 56. The piping 57 is connected to the source for the processing gas G2, air-tightly penetrates the chamber 20, and extends into the interior of the chamber 20, and an end thereof opens as the gas inlet 56.

The gas inlet 56 opens at the processing space 59 between the window 52 and the rotary table 31 and introduces the processing gas G2. Noble gas is employed for the processing gas G2, and argon gas and the like is suitable.

In the nitriding processing unit 50, high-frequency voltage is applied to the antenna 53 from the RF power supply 54. By this, high-frequency current flows in the antenna 53 and electric field by electromagnetic induction is generated. The electric field is generated at the processing space 59 via the window 52 and inductively coupled plasma is generated in the processing gas G2. At this time, chemical species of nitrogen containing nitrogen atoms is produced, and the species bombards the film containing Ga atoms and the film containing Al atoms on the workpiece 10 and bonds with Ga atoms and Al atoms. As a result, the nitrogen content of the film on the workpiece 10 is increased, and GaN film and AlN film without nitrogen deficiency can be obtained.

[Heating Unit]

The heating unit 60 heats the workpiece 10 circulated and transported by the rotary table 31 in the chamber 20. The heater 60 includes a heat source provided at a position facing the transporting path L of the workpiece 10 on the rotary table 31. For example, the heat source is a halogen lamp. For example, it is preferable that the heating temperature is temperature that heats the workpiece 10 to about 500° C.

[Transfer Chamber]

The transfer chamber 70 is a container for carrying the workpiece 10 in and out the chamber 20 via a gate valve. As illustrated in FIG. 1, the transfer chamber 70 includes an interior space to house the workpiece 10 before it is carried into the chamber 20. The transfer chamber 70 is connected to the chamber 20 via a gate valve GV1. Although not illustrated, transporting means to carry a tray 34 on which the workpiece 10 is loaded in and out the chamber 20 is provided in the interior space of the transfer chamber 70. The transfer chamber 70 is depressurized by an unillustrated exhaustion mean such as a vacuum pump, and carries in the tray 34 on which unprocessed workpiece 10 is loaded into the chamber 20 and carries out the tray 34 on which processed workpiece 10 is loaded by the transporting means while keeping a vacuum condition in the chamber 20.

The transfer chamber 70 is connected to a load lock 71 via a gate valve GV2. The load lock 71 is a device to carry in the tray 34 on which unprocessed workpiece 10 is loaded into the transfer chamber 70 from outside and carries out the tray 34 on which processed workpiece 10 from the transfer chamber 70 is loaded by the transporting mean while keeping a vacuum condition in the transfer chamber 70. Note that, in the load lock 71, the vacuum condition which is depressurized by the unillustrated exhaustion mean such as a vacuum pump and the air-open condition in which vacuum is broken are switched.

[Pre-Heating Chamber]

The pre-heating chamber 80 heats the workpiece 10 before being carried into the chamber 20. The pre-heating chamber 80 includes a container connected to the transfer chamber 70 and a heat source to heat the workpiece 10 before being carried into the chamber 70. For example, the heat source is a heater or a heating lamp. For example, it is preferable that the pre-heating temperature is temperature that heats the workpiece 10 to about 300° C. Note that the tray 34 is transported between the pre-heating chamber 80 and the transfer chamber 70 by an unillustrated transporting mean.

[Cooling Chamber]

The cooling chamber 90 cools the workpiece 10 carried out from the chamber 20. The cooling chamber 90 includes a container connected to the transfer chamber 70 and a cooling mean to cool the workpiece 10 loaded on the tray 34 carried out from the transfer chamber 70. For example, the cooling mean may be a spray to spray cooling gas. For example, the cooling gas may be Ar gas from the source of the sputtering gas G1. It is preferable that cooling temperature is temperature that allows transportation in the air, for example, 30° C. Note that the tray 34 loading the processed workpiece 10 in the transfer chamber 70 is carried into the cooling chamber by an unillustrated transporting mean.

[Controller]

The controller 100 controls various components of the film formation apparatus 1, such as the exhaustion unit 23, the sputtering gas introducer 49, the processing gas introducer 58, the power supply 46, the RF power supply 54, the transporting unit 30, the heating unit 60, the transfer chamber 70, the load lock 71, the pre-heating chamber 80, and the cooling chamber 90. The controller 100 is a processing device including PLC (Programmable Logic Controller) and CPU (Central Processing Unit) and stores programs describing control contents.

Detailed control contents may be initial exhaustion pressure of the film formation apparatus 1, power applied to the target 42 and the antenna 53, flow amount of the sputtering gas G1 and the processing gas G2, introduction time and exhaustion time, film formation time, and rotation speed of the motor 32. By this, the controller 100 can perform wide variety of film formation specification. Furthermore, the controller 100 controls heating temperature and time of the heating unit 60, heating temperature and time of the pre-heating unit 80, and cooling temperature and time of the cooling unit 90.

[Action]

Figure 3:
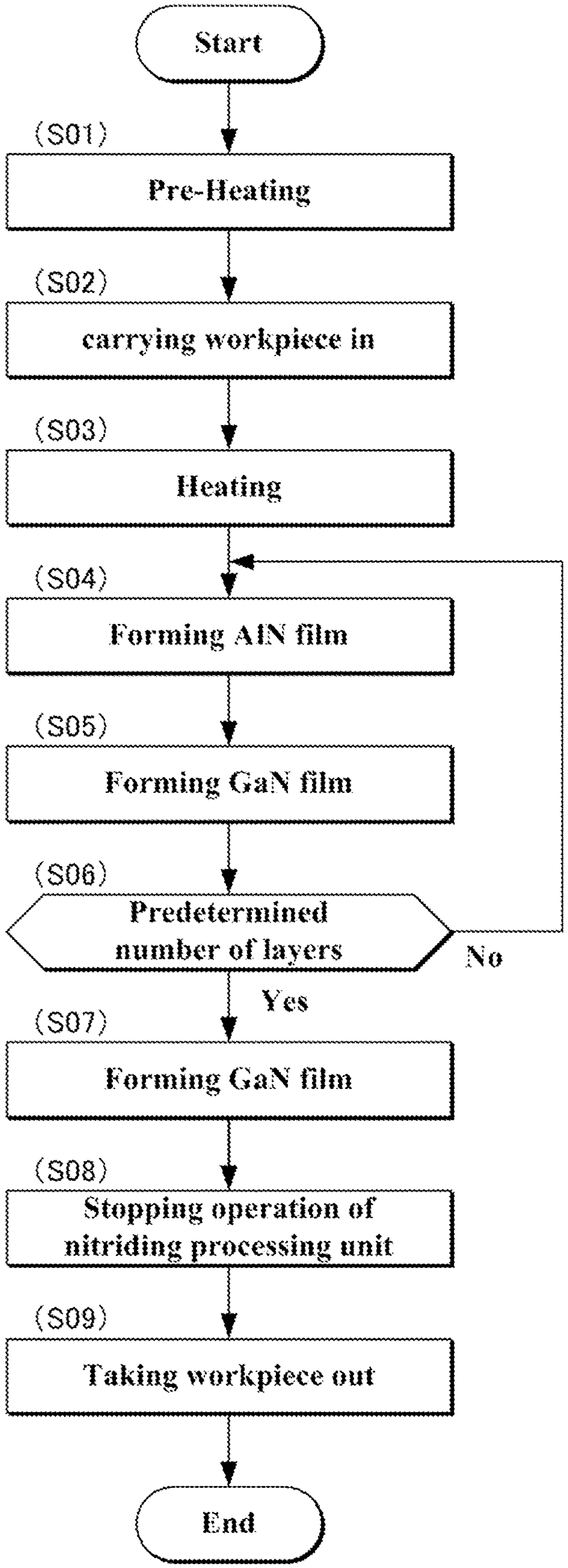
FIG. 3 is a flowchart of processes of the film formation apparatus according to the embodiment.

Next, action of the film formation apparatus 1 controlled by the controller 100 will be described. Note that, as described below, the film formation method to form film by the film formation apparatus 1 is also an aspect of the present disclosure. FIG. 3 is a flowchart of film formation processes by the film formation apparatus 1 according to the embodiment. The film formation process is a process to alternately form layers of AlN film and GaN film, and to further form GaN layer. Since silicon wafers and sapphire substrates have crystal lattice different from GaN, if GaN film is directly formed, there is a problem that the crystallinity of GaN decreases. To address this mismatch of crystal lattice, layers of AlN film and GaN film are alternately deposited to form a buffer layer, and the GaN layer is formed on the buffer layer. For example, in the production of lateral MOSFET or LED, this can be used to form the GaN layer on the silicon wafer via the buffer layer.

Firstly, pressure inside the chamber 20 is always reduced to predetermined pressure by exhaustion by the exhaustion unit 23 from the exhaustion port 21. Furthermore, along with the exhaustion, the heating unit 60 starts heating, the rotary table 31 starts rotating, so that the rotary table 31 passing though the heating unit 60 is heated. The interior of the chamber 20 is heated by radiation from the heated rotary table 31. Heating while exhaustion facilitates desorption of residual gas in the chamber 20, such as water molecules and oxygen molecules. By this, the residual gas less contaminates as impurities at the time of the film formation, and the crystallinity of the film is improved. After detecting that the oxygen concentration inside the chamber 20 became equal to or less than the predetermined value by a gas analyzation apparatus such as Q-Mass, the heating unit 60 stops heating and the rotary table 31 stops rotating. Furthermore, inside the pre-heating chamber 80, the workpiece 10 loaded on the tray 34 is pre-heated to about 300° C. (Step S01).

The tray 34 loading the pre-heated workpiece 10 is carried to the transfer chamber 70 by the transporting mean and is sequentially carried into the chamber 20 via the gate valve GV1 (Step S02). In Step S02, the rotary table 31 sequentially moves the empty holder 33 to transporting position from the transfer chamber 70. The holder 33 holds each tray 34 that was carried in by the transporting mean. Accordingly, all trays 34 on which the workpiece 10 is placed are placed on the rotary table 31.

Again, the heating unit 60 starts heating and the rotary table 31 on which the workpiece 10 is placed starts rotating to heat the workpiece 10 (Step S03). When a predetermined time obtained in advance by, for example, simulation and experiment, the workpiece 10 is heated to about 500° C. Note that, during the heating, the rotary table 31 is rotated at relatively high speed of about 100 rpm for uniform heating.

Then, the buffer layer is formed by repeatedly and alternately performing the formation of the AlN film by the Al film formation processing unit 40B and the nitriding processing unit 50 and the formation of the GaN film by the GaN film formation processing unit 40A and the nitriding processing unit 50. Firstly, the Al film formation processing unit 40B and the nitriding processing unit 50 form the AlN film on the workpiece 10 (Step S04). That is, the sputtering gas introducer 49 supplies the sputtering gas G1 through the gas inlet 47. The sputtering gas G1 is supplied around the target 42 formed of Al. The power supply 46 applies voltage to the target 42. Accordingly, the sputtering gas G1 becomes plasma. The ions produced by the plasma bombards the target 42 and beat out sputtering particles containing Al.

Thin film which is the deposited sputtering particles containing Al atoms is formed on a surface of the unprocessed workpiece 10 when the workpiece 10 passes through the Al film formation processing unit 40 B. In the present embodiment, the film is deposited at a thickness that can include one or two Al atoms in the thickness direction each time the workpiece 10 passes through the Al film formation processing unit 40 B.

Accordingly, the workpiece 10 that has passed through the Al film formation processing unit 40B by the rotation of the rotary table 31 passes through the nitriding processing unit 50, and Al atoms of the thin film is nitrided in said process. That is, the processing gas introducer 58 supplies the sputtering gas G2 containing nitrogen gas through the gas inlet 56. The processing gas G2 containing nitrogen gas is supplied to the processing space 59 between the window 52 and the rotary table 31. The RF power supply 54 applies high-frequency voltage to the antenna 53.

The electric field generated by the antenna 53 through which high-frequency current has flown by the application of high-frequency voltage is generated in the processing space 59 via the window 52. Then, the electric field excites the processing gas G2 containing nitrogen gas supplied to the processing space 59 and produces plasma. The chemical species of nitrogen produced by the plasma bombards the thin film on the workpiece 10 and bonds with Al atoms, so that the AlN film that is sufficiently nitrided is formed.

The rotary table 31 continues to rotate until the AlN film with predetermined thickness is formed on the workpiece 10, that is, until the predetermined time obtained in advance by, for example, simulation and experiment has elapsed. In other word, the workpiece 10 continues to circulate through the film formation processing unit 40 and the nitriding processing unit 50 until the AlN film with predetermined thickness is formed. Note that the rotation speed of the rotary table 31 is relatively slow as 50 to 60 rpm to take balance between the film formation and the nitriding, because it is preferable to perform nitriding each time Al is deposited at atomic thickness.

After the predetermined time, firstly, the operation of the Al film formation processing unit 40B is stopped. In detail, the power supply 46 stops to apply voltage to the target 42.

Next, the GaN film formation processing unit 40A and the nitriding processing unit 50 form the GaN film on the workpiece 10 (Step S05). That is, the sputtering gas G1 is supplied around the target 42 by the sputtering gas introducer 49 and voltage is applied to the target 42 by the power supply 46 to produce plasma sputtering gas G1. The ions produced by the plasma bombards the target 42 and beat out sputtering particles containing Ga atoms.

Thin film which is the deposited sputtering particles containing Ga atoms is formed on a surface of the AlN film. In the present embodiment, the film is deposited at a thickness that can include one or two Ga atoms in the thickness direction each time the workpiece 10 passes through the film formation processing unit 40.

Accordingly, the workpiece 10 that has passed through the GaN film formation processing unit 40A by the rotation of the rotary table 31 passes through the nitriding processing unit 50, and Ga atoms of the thin film is nitrided in said process. That is, as described above, the chemical species of nitrogen produced by the plasma bombards the thin film on the workpiece 10 and bonds with Ga atoms that lacks bonding with nitrogen, so that the GaN film without nitrogen deficiency is formed.

The rotary table 31 continues to rotate until the GaN film with predetermined thickness is formed on the workpiece 10, that is, until the predetermined time obtained in advance by, for example, simulation and experiment has elapsed, and then the operation of the film formation processing unit 40 is stopped. That is, after the predetermined time, the operation of the GaN film formation processing unit 40A is stopped. In detail, the power supply 46 stops to apply voltage to the target 42. The formation of the AlN film and the GaN film as described above is repeated until predetermined layers of the film are formed (Step S06, No). When predetermined layers of the film is formed (Step 06, Yes), the formation of the buffer layer is completed.

Furthermore, GaN layer is formed on the buffer layer (Step S07). This GaN layer is formed in the same way as the GaN layer in the above buffer layer. However, the film is formed for the time required to form GaN layer with predetermined thickness.

After the formation of the buffer layer and the GaN layer as described above, the operation of the GaN film formation processing unit 40A is stopped, and then the operation of the nitriding processing unit 50 is stopped as described above (Step S09). In detail, the RF power supply 54 stops to supply high-frequency electric power to the antenna 53. Then, the rotation of the rotary table 31 is stopped, and the tray 34 on which the film-formed workpiece 10 is placed is carried into the cooling unit 90 via the transfer chamber 70 by the transporting mean, and is carried out from the load lock 71 after the workpiece 10 is cooled to the predetermined temperature.

Note that, in the above description, although the nitriding processing unit 50 continues to operate while forming the buffer layer (Steps S04 to S06), the nitriding processing unit 50 may be stopped every time each of the steps S04 to S06 is stopped. In this case, the operation of the nitriding processing unit 50 is stopped after the operation of Al film formation processing unit 40B and GaN film formation processing unit 40A is stopped. As a result, the surface of the film formed on the workpiece 10 can be sufficiently nitrided, and GaN film and AlN film without nitrogen deficiency can be obtained.

[Effect]

(1) The film formation apparatus 1 of the present embodiment includes: the chamber 20 which an interior thereof can be made vacuum; the rotary table 31 provided inside the chamber 20, holding a workpiece 10, and circulating and transporting the workpiece 10 in a circular trajectory, a GaN film formation processing unit 40A including a target 42 formed of film formation material containing GaN and a plasma generator which turns sputtering gas introduced between the target 42 and the rotary table 31 into plasma, the GaN film formation processing unit 40A depositing by sputtering the film formation material containing GaN on the workpiece 10 circulated and transported by the rotary table 31; and a nitriding processing unit 50 nitriding particles of the film formation material deposited on the workpiece 10 circulated and transported by the rotary table 31 in the GaN film formation processing unit 40A.

The film formation method of the present embodiment circulates and transports a workpiece 10 by a rotary table 31 in a circular trajectory and forms film on the workpiece 10 in a chamber 20 which an interior thereof can be made vacuum, the method includes: a GaN film formation processing of depositing by sputtering particles of the film formation material containing GaN on the workpiece 10 circulated and transported by the rotary table 31 in a GaN film formation processing unit 40A including a target 42 formed of the film formation material containing GaN and a plasma generator making sputtering gas introduced between the target 42 and the rotary table 31 into plasma; and the nitriding processing of nitriding the particles of the film formation material deposited on the workpiece 10 circulated and transported by the rotary table 31 in the GaN film formation processing unit 40A by a nitriding processing unit 50.

In the present embodiment, by forming film on the workpiece 10 circulated and transported by the rotary table 31 in the chamber 20 by sputtering, the GaN film can be formed with high productivity. That is, since the present embodiment does not need to use a large amount of NH3 gas like NO-CVD method, and material of the target 42 is deposited and nitrided with atomic thickness by flowing the sputtering gas G1 and the processing gas G2 into the limited space inside the vacuum chamber 20, the usage efficiency of the material is high. Furthermore, since reaction gas containing hydrogen (H) is not used, extra processes such as dehydrogenation is not necessary. In addition, since only easy-to-handle noble gas is introduced into the chamber 20, it is easy to maintain the condition of the apparatus stable, resulting in good yields. Since the heating temperature is relatively low as about 500° C., the power required for the heater is also small. Since a series of film formation process of the buffer layer and the GaN layer is completed in the chamber 20, it is not necessary to move the workpiece 10 to other chambers to form different layers during the series of film formation, and the film can be formed under the same environment with low oxygen concentration.

Furthermore, since the formation of the film with the thickness of atomic level, and the nitriding is repeated, the film with high crystallinity and low surface unevenness can be formed in a short time compared with the MO-CVD method.

Evaluation results for the film formed under the below condition is shown.

workpiece: Si(111) substrate rotation of the rotary table: 60 rpm high-frequency electric power applied to the antenna (the nitriding processing unit): 4000 W DC power applied to the sputtering source: GaN film formation processing unit 800 to 1500 W, Al film formation processing unit 2000 to 3500 W (respective values of power applied to the sputtering sources in the film formation processing unit including two sputtering sources)

Film formation rate: GaN layer 0.28 nm/sec, AlN layer 0.43 nm/sec

Ar gas flow rate in the film formation processing unit: GaN film formation processing unit 80 sccm, Al film formation processing unit 45 sccm N2 gas flow rate in the nitriding processing unit: 30 sccm Note that the heating is not performed during the film formation in the above embodiment.

3 μm AlN film (No. 1), 3 μm GaN film (No. 2), 30-layer film of 5 nm AlN film/5 nm GaN film (No. 3), film which 3 μm GaN film is formed on 30-layer film of 5 nm AlN film/5 nm GaN film (No. 4) were formed on the workpieces 10 and were analyzed by X-ray diffraction. As a result, half width (°) of rocking curves of (002) surface of the film surface obtained by 2θ/ω scan were 0.246 in No. 1, 0.182 in No. 2, 0.178 in No. 3, and 0.197 in No. 4.

In general, smaller the half width, less variation in crystallographic orientation and higher the crystallinity. In the present embodiment, film with high crystallinity and half width of 0.2° or less can be formed. Furthermore, the film thickness of the GaN buffer layer used in GaN-based devices is generally 3 to 10 μm, and the film formation rate in MO-CVD method is several μm/h. Although the film formation rate in the present film formation rate is similar, the film formation time is shorter when compared with MO- CVD method, because the present embodiment can omit hydrogen desorption process. Furthermore, the film with high crystallinity can be obtained even in low-temperature film formation when compared to MO-CVD method.

In addition, there is a problem that the surface becomes an insulator when large amount of nitrogen is contained in the solid target 42 so that the target 42 cannot contain nitrogen in large amount and contain Ga atoms lacking bonds with nitrogen. If such a target 42 is used for the sputtering, GaN film with nitrogen deficiency will be formed. However, the present embodiment provides the nitriding processing unit 50 that is separate from the GaN film formation processing unit 40A, such that even when the target 42 contains Ga atoms lacking bonds with nitrogen, the GaN film without nitrogen deficiency can be obtained at last by increasing the nitrogen content using the nitriding processing unit 50. Furthermore, the GaN film formation processing unit 40A may not use nitrogen gas and may use single argon gas as the sputtering gas G1, and the nitriding processing unit 50 that is separate from the GaN film formation processing unit 40A may nitride the particles of the film formation material deposited on the workpiece 10. Thus, the surface of the target 42 does not become an insulator, and the film formation rate can be improved using DC discharge.

(2) The film formation apparatus 1 includes the Al film formation processing unit 40B including the target 42 formed of film formation material containing Al and depositing by sputtering the film formation material containing Al on the workpiece 10 circulated and transported by the rotary table 31, and the nitriding processing unit 50 nitrides the particles of the film formation material deposited on the workpiece 10 circulated and transported by the rotary table 31 in the Al film formation processing unit 40B.

Therefore, for example, when workpiece 10 that has crystal lattice different from GaN, such as silicon, is used, by forming the buffer layer that is alternately deposited GaN film and AlN film using the GaN film formation processing unit 40A, the Al film formation processing unit 40B, and the nitriding unit 50, the reduction in crystallinity of GaN can be prevented.

Furthermore, since the GaN layer can be formed without being exposed to the air after the buffer layer has been formed, the uppermost surface of the buffer layer is suppressed from being altered, and alteration of the GaN layer formed on the buffer layer can be prevented. In addition, it is not necessary to move the workpiece 10 to environment other than the environment for forming the buffer layer to form GaN layer, and therefore, the transporting time is reduced and it is not necessary to separately provide space with modified oxygen concentration, etc.

Furthermore, the AlN film formation processing unit 40B also may not use nitrogen gas and may use single argon gas as the sputtering gas G1, and the nitriding processing unit 50 that is separate from the Al film formation processing unit 40B may nitride the particles of the film formation material deposited on the workpiece 10. Thus, the surface of the target 42 does not become an insulator, and the film formation rate can be improved using DC discharge.

(3) The film formation apparatus 1 includes the heating unit 60 to heat the workpiece 10 circulated and transported by the rotary table 31. Thus, the film with excellent crystallinity can be formed.

(4) The film formation apparatus 1 includes the pre-heating chamber 80 to heat the workpiece 10 before being carried into the chamber 20. By heating the workpiece using the pre-heating chamber 80 in advance, the heating time by the heating unit 60 is reduced and the productivity can be improved.

Figure 4:
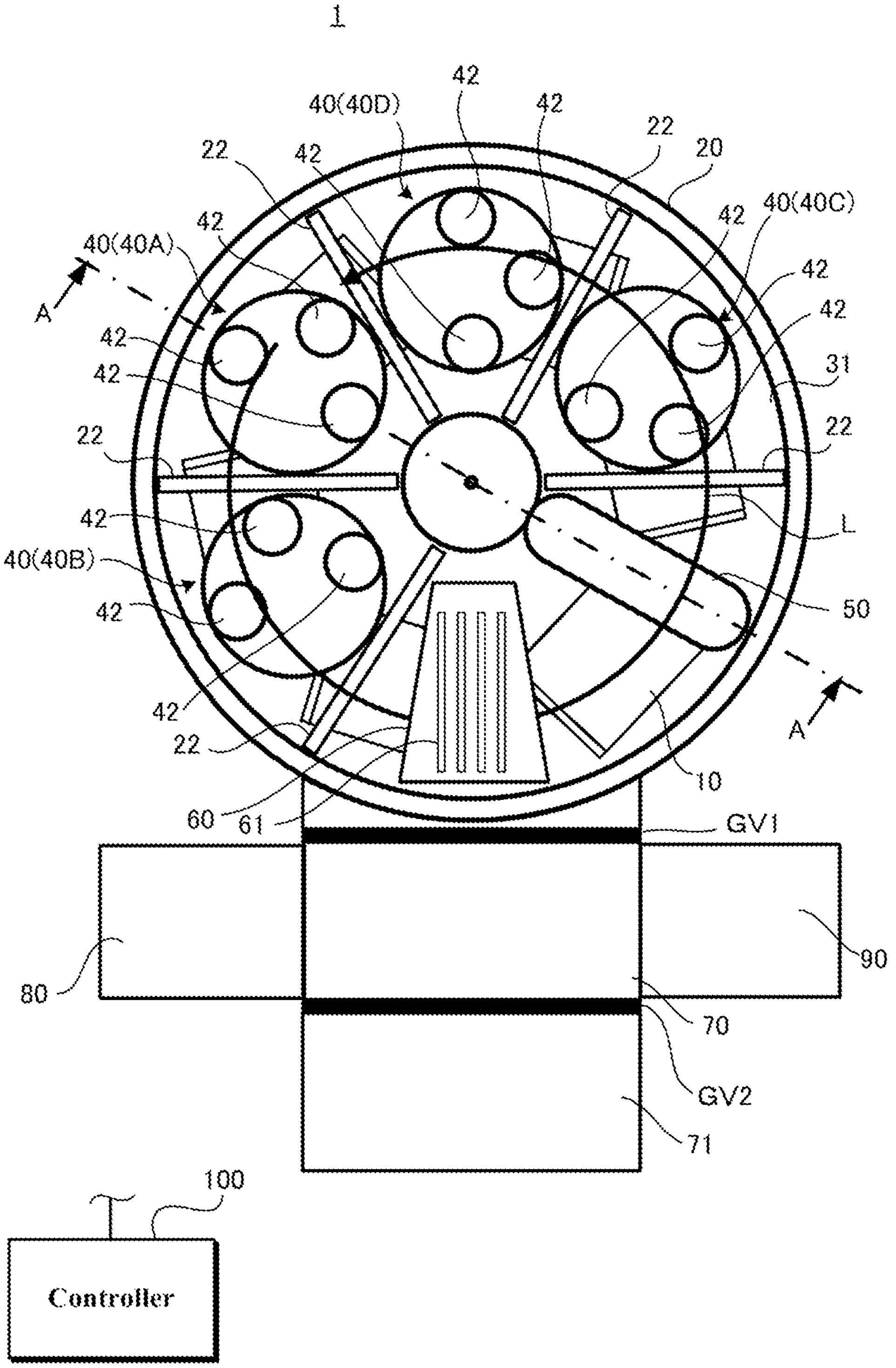
FIG. 4 is a transparent plan view schematically illustrating a modified example of the embodiment.

Modified Example (1) In the above embodiment, as illustrated in FIG. 4, an impurity addition processing unit to add n-type or p-type impurities (dopant) to the formed GaN film may be provided. In this case, the GaN film formation processing unit, the nitriding processing unit, and the impurity addition processing unit are arranged in line in this order along the circulation and transportation path. The impurity addition processing unit includes the same configuration as the film formation processing units 40A and 40B. In detail, the impurity addition processing unit includes a target formed of film formation material containing n-type impurities or p-type impurities and a plasma generator, and may add particles (sputtering particles) of the film formation material containing ions that are impurities to the film deposited on the workpiece 10 by sputtering the target. For example, the impurity addition processing unit may be a Mg film formation processing unit 40C including a target 42 formed of film formation material containing Mg or a Si film formation processing unit 40D including a target 42 formed of film formation material containing Si. The Mg film formation processing unit 40C and Si film formation processing unit 40D include the same configuration as the film formation processing units 40A except for the material for the target 42. That is, the film formation processing unit 40D includes the target 42, a sputtering source formed by a backing plate 43 and an electrode 44, and a plasma generator formed by a power supply 46 and a sputtering gas introducer 49.

In such aspects, by operating the Mg film formation processing unit 40C together with the GaN film formation processing unit 40A and the nitriding processing unit 50 at the time of GaN film formation, a layer containing a p-channel (p-type semiconductor) to which Mg ions are added can be formed on the GaN layer. Furthermore, by operating the Si film formation processing unit 40D together with the GaN film formation processing unit 40A and the nitriding processing unit 50 at the time of GaN film formation, a layer containing a n-channel (n-type semiconductor) to which Si ions are added can be formed on the GaN layer.

To form the n-channel and the p-channel, conventionally, Mg and Si ions were added by implanting said ions by ion implant devices, such as ion beam, and and heat-processing them, after the GaN film formation. However, in such a method, since ions were implanted to the film with predetermined thickness, implant depth, implant amount (dosage amount) may differ from designed values, and its control was not easy. According to the present embodiment, the deposition of GaN film and the addition of Si ions or Mg ions are alternately repeated until the thickness of the GaN film becomes the predetermined thickness. This facilitates to control the implant depth and implant amount of Mg ions and Si ions according to the thickness of the GaN film formed per one rotation depending on the power applied to the target 42 and the rotation speed of the rotary table 31.

Furthermore, a series of the buffer layer, the GaN layer, the layer containing n-channel, and the layer containing p-channel can be formed in one chamber 20. Therefore, it is not necessary to move the workpiece 10 to environment other than the environment for forming the GaN layer to form n-channel and p-channel, and the transporting time is reduced and it is not necessary to separately provide space with modified oxygen concentration, etc.

Figure 5:
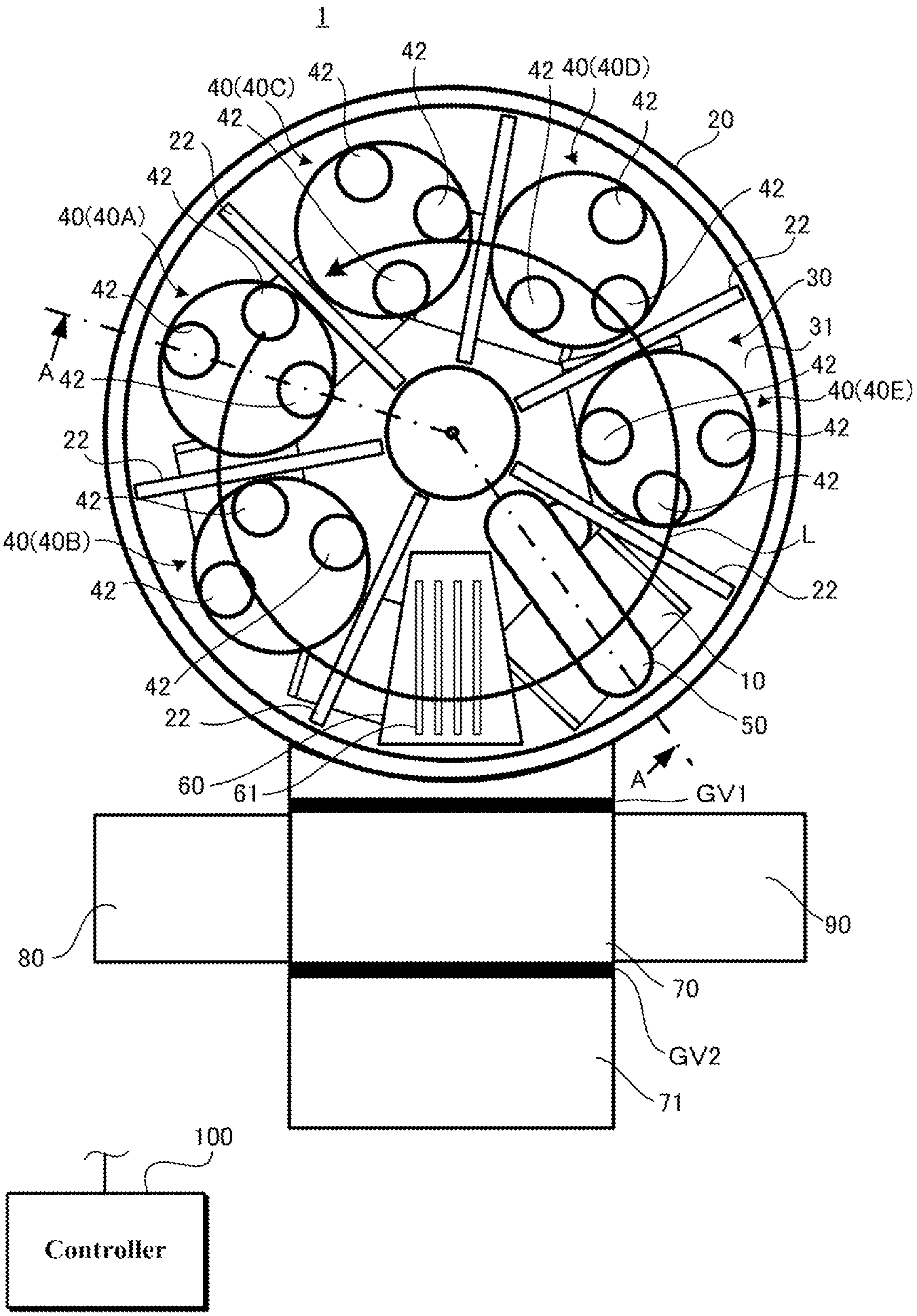
FIG. 5 is a transparent plan view schematically illustrating a modified example of the embodiment.

(2) In addition to the above aspects, as illustrated in FIG. 5, an InN film formation processing unit 40E including a target 42 formed of film formation material containing InN may be provided as the film formation processing unit 40. Since indium (In) alone has low melting point, in practice, an InN target to which nitrogen is added is used as the solid target 42. Similarly to the above, the InN target contains In atoms lacking bonds with nitrogen.

Figure 6:
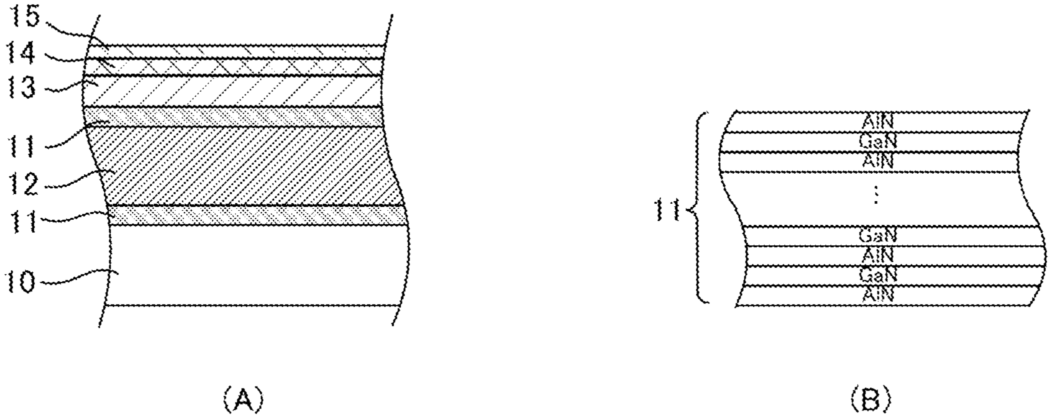
FIG. 6(A) is a cross sectional diagram illustrating an example of a LED layer structure.
FIG. 6(B) is an enlarged view of a buffer layer.

In such aspects, by operating the InN film formation processing unit 40E together with the GaN film formation processing unit 40A and the nitriding processing unit 50 at the time of GaN film formation, InGaN film can be formed. As illustrated in FIG. 6(A), the InGaN film acts as a light emitting layer 14 of LED. FIG. 6(A) illustrates a layer structure of LED, and the buffer layer 11, the GaN layer 12 containing n-channel, the buffer layer 11, the GaN layer 13 containing p-channel, the light emitting layer 14, and the transparent conductive film 15 are layered on the silicon workpiece 10. The transparent conductive film 15 is ITO (Indium Tin Oxide) film. Note that the electrode is not illustrated in the figure. In addition, FIG. 6(B) illustrates the buffer layer 11.

In such an aspect, a series of the buffer layer 11, the GaN layer 12 containing n-channel, the buffer layer 11, the GaN layer 13 containing p-channel, and the light emitting layer 14 in the LED can be formed in one chamber 20. Therefore, it is not necessary to move the workpiece 10 to environment other than the environment for forming the GaN layer to form the light emitting layer 14, and the transporting time is reduced. Also, it is not necessary to separately provide space with modified oxygen concentration, etc. Furthermore, color of the light emitting layer 14 can be changed depending on the thickness, and in this aspect, since the thickness can be easily controlled, the light emitting layer 14 with different colors can be easily produced.

(3) The power supply used in the film formation processing unit to form film of different kinds of material may be different types of power supplies. For example, the power supply used in one of the film formation processing unit may be a DC power supply, and the power supply used in the other of the film formation processing unit may be a pulse power supply including a pulse switch. In this case, when adding Mg ions as described above, the power supply used in the GaN film formation processing unit 40A may be a DC power supply, and the power supply used in the Mg film formation processing unit 40C may be a pulse power supply. Or, when adding Si ions as described above, the power supply used in the GaN film formation processing unit 40A may be a DC power supply, and the power supply used in the Si film formation processing unit 40D may be a pulse power supply. In particular, by setting pulse width and electric power to apply large amount of electric power by pulse wave in a short time to perform HiPIMS (High Power Impulse Magnetron Sputtering), high-density plasma is produced, and ionization rate of the sputtering particles is dramatically increased, and the ion implant can be more efficiently performed.

Otherwise, the power supply used in the film formation processing unit to form film of same kind of material may be combination of different types of power supplies and may be switched at predetermined timing. For example, the power supply may include both a DC power supply and a pulse power supply including a pulse switch and may be switched at predetermined timing. In this case, when forming GaN film, the pulse power supply may be used for only the initial layer which contacts with the substrate or the layer of other kinds, and after the film with predetermined thickness is formed, the power supply may be switched to the DC power supply.

Other Embodiment

Although the modified examples of the embodiments and portions according to the present disclosure are described, these modified examples of the embodiments and portions are only presented as examples and are not intended to limit the scope of the claims. These new embodiments described above can be implemented in other various forms, and various omission, replacement, modification, and change may be performed without departing from an abstract of the invention. These embodiments and modification thereof are included in the scope and abstract of the invention, and are included in the invention described in the scope of the claims.

Furthermore, the type and number of the film formation processing unit 40 and the number of the nitriding processing unit 50 provided in the chamber are not limited to the above aspects. The film formation processing unit 40 may only include the GaN film formation processing unit 40A and may be the film formation processing apparatus 1 to form GaN film. Furthermore, in addition to the above film formation processing unit 40, the film formation processing unit 40 with other target material may be provided, the film formation processing unit 40 with the same material target may be provided, and the nitriding processing unit 50 may be provided. For example, the film formation processing unit 40 including a target 42 containing indium oxide and tin oxide that is the film formation material of ITO may be added to form ITO film in the chamber 20. In this case, in the nitriding processing unit 50, oxygen gas may be introduced instead of nitrogen gas to supplement the oxidation of the ITO film. In addition, for example, the GaN film formation processing unit 40A, the Al film formation processing unit 40B, and the nitriding processing unit 50 may be operated at the same time to form AlGaN (Aluminum Gallium Nitride) film that contain Ga, Al, and N.

Moreover, the n-type impurity and the p-type impurity added in the impurity addition processing unit are not limited to the above embodiments. For example, the n-type impurity may be Ge or Sn. In this case, the film formation material forming the target provided in the impurity addition processing unit may be film formation material containing Ge and Sn instead of Si.

REFERENCE SIGN

1: film formation apparatus
10: workpiece
11: buffer layer
12: GaN layer
13: GaN layer
14: light emitting layer
15: transparent conductive film
20: chamber
20*a*: ceiling
20*b*: inner bottom
20C: inner surface
21: exhaustion port
22: divider
23: exhaustion unit

30: transporting unit
31: rotary table
32: motor
33: holder
34: tray
40: film formation processing unit
40A: GaN film formation processing unit
40B: Al film formation processing unit
40C: Mg film formation processing unit
40D: Si film formation processing unit
40E: InN film formation processing unit
41: processing space
42: target
43: backing plate
44: electrode foil
46: power supply
47: gas inlet
48: piping
49: sputtering gas introducer
50: nitriding processing unit
51: cylinder body
52: window
53: antenna
54: power supply
55: matching box
56: gas inlet
57: piping
58: processing gas introducer
59: processing space
60: heating unit
70: transfer chamber
71: load lock
80: pre-heating chamber
90: cooling chamber
100: controller

The invention claimed is:

1. A film formation apparatus comprising:

a chamber which an interior thereof can be made vacuum;

a rotary table provided inside the chamber, holding a workpiece, and circulating and transporting the workpiece in a circular trajectory;

a GaN film formation processing unit including a target formed of film formation material containing GaN and a plasma generator which turns sputtering gas introduced between said target formed of film formation material containing GaN and the rotary table into plasma, the GaN film formation processing unit depositing by sputtering particles of the film formation material containing GaN on the workpiece circulated and transported by the rotary table; and a nitriding processing unit to nitride particles of the film formation material deposited on the workpiece circulated and transported by the rotary table in the GaN film formation processing unit; and an impurity addition processing unit to add n-type impurity or p-type impurity on the particles of the film formation material containing GaN deposited on the workpiece in the GaN film formation processing unit by sputtering, the impurity addition processing unit comprising a target formed of film formation material containing n-type impurity or p-type impurity and plasma generator making sputtering gas introduced between the target formed of film formation material containing n-type impurity or p-type impurity and the rotary table into plasma, wherein the GaN film formation processing unit, the nitriding processing unit, and the impurity addition processing unit each have a processing space apart from each other, with each processing space arranged above and along the circulation and transportation path;

and wherein the rotary table repeatedly passes the workpiece through the GaN film formation processing unit, the nitriding processing unit, and the impurity addition processing unit in this order to repeat film formation, nitriding, and impurity addition of GaN film and forms, on the workpiece, a predetermined number of layers of GaN films containing n-type impurity or p-type impurity.

2. The film formation apparatus according to claim 1, wherein the sputtering gas is single argon gas.

3. The film formation apparatus according to claim 1, further comprising:

an Al film formation processing unit including a target formed of film formation material containing Al and depositing by sputtering particles of the film formation material containing Al on the workpiece circulated and transported by the rotary table, wherein the nitriding processing unit nitrides the particles of the film formation material deposited on the workpiece circulated and transported by the rotary table in the Al film formation processing unit.

4. The film formation apparatus according to claim 3, wherein:

the GaN film formation processing unit, the Al film formation processing unit, and the nitriding processing unit form in which GaN film and AlN film are alternately formed.

5. The film formation apparatus according to claim 1, wherein:

the impurity addition processing unit is a Mg film formation processing unit including a target formed of film formation material containing Mg and depositing by sputtering particles of the film formation material containing Mg on the workpiece circulated and transported by the rotary table, wherein the GaN film formation processing unit, the nitriding processing unit, and the Mg film formation processing unit form film in which Mg is added to GaN.

6. The film formation apparatus according to claim 1, wherein:

the impurity addition processing unit is a Si film formation processing unit including a target formed of film formation material containing Si and depositing by sputtering particles of the film formation material containing Si on the workpiece circulated and transported by the rotary table, and the GaN film formation processing unit, the nitriding processing unit, and the Si film formation processing unit form film in which Si added to GaN.

7. The film formation apparatus according to claim 1, comprising:

an InN film formation processing unit including a target formed of film formation material containing InN and depositing by sputtering particles of the film formation material containing InN on the workpiece circulated and transported by the rotary table, wherein the GaN film formation processing unit, the nitriding processing unit, and the inN film formation processing unit form InGaN film.

8. The film formation apparatus according to claim 1, comprising a heating unit to heat the workpiece circulated and transported by the rotary table.

9. The film formation apparatus according to claim 8, further comprising a pre-heating chamber to heat the workpiece before being carried into the chamber.

10. The film formation apparatus according to claim 1, wherein electric power is applied to the impurity addition processing unit by a pulse power supply.

11. A film formation method circulating and transporting a workpiece by a rotary table in a circular trajectory and forming film on the workpiece in a chamber which an interior thereof can be made vacuum, the method comprising:

a GaN film formation processing of depositing by sputtering particles of the film formation material containing GaN on the workpiece circulated and transported by the rotary table in a GaN film formation processing unit including a target formed of particles of the film formation material containing GaN and a plasma generator making sputtering gas introduced between the target and the rotary table into plasma; and a nitriding processing of nitriding the particles of the film formation material deposited on the workpiece circulated and transported by the rotary table in the GaN film formation processing unit; and an impurity addition processing of adding n-type impurity or p-type impurity on the particles of the film formation material containing GaN deposited on the workpiece in the GaN film formation processing by sputtering, wherein the GaN film formation processing, the nitriding processing, and the impurity addition each are performed in a processing space apart from each other, each processing space is arranged above and along the circulation and transportation path, and wherein the workpiece is circulated and transported to repeatedly perform the GaN film formation processing, the nitriding processing, and the impurity addition processing in this order, thereby forming, on the workpiece, a predetermined number of layers of GaN films containing n-type impurity or p-type impurity.

* * * * *